(12) United States Patent
Yu et al.

(10) Patent No.: US 11,094,798 B2
(45) Date of Patent: Aug. 17, 2021

(54) VERTICAL FET WITH SYMMETRIC JUNCTIONS

(71) Applicant: INTERNATIONAL BUSINESS MACHINES CORPORATION, Armonk, NY (US)

(72) Inventors: Lan Yu, Voorheesville, NY (US); Xin Miao, Slingerlands, NY (US); Chen Zhang, Albany, NY (US); Heng Wu, Guilderland, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/441,640

(22) Filed: Jun. 14, 2019

(65) Prior Publication Data
US 2020/0395467 A1 Dec. 17, 2020

(51) Int. Cl.
| | |
|---|---|
| H01L 29/76 | (2006.01) |
| H01L 29/66 | (2006.01) |
| H01L 29/40 | (2006.01) |
| H01L 21/324 | (2006.01) |
| H01L 29/78 | (2006.01) |

(52) U.S. Cl.
CPC ...... *H01L 29/66666* (2013.01); *H01L 21/324* (2013.01); *H01L 29/401* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 5,124,764 A | 6/1992 | Mori | |
| 5,364,810 A | 11/1994 | Kosa | |
| 7,368,352 B2 | 5/2008 | Kim | |
| 8,163,619 B2 | 4/2012 | Yang | |

(Continued)

FOREIGN PATENT DOCUMENTS

WO 2018136478 A1 7/2018

OTHER PUBLICATIONS

Guerfi et al., "Vertical Silicon Nanowire Field Effect Transistors with Nanoscale Gate-All-Around", Nanoscale Research Letters, Published Dec. 2016 [uploaded on May 21, 2016], 8 pages, DOI: 10.1186/s11671-016-1396-7, Retrieved from internet: <URL: https://www.researchgate.net/publication/301524675_Vertical_Silicon_Nanowire_Field_Effect_Transistors_with_Nanoscale_Gate-All-Around/download>.

*Primary Examiner* — Hung K Vu
(74) *Attorney, Agent, or Firm* — L. Jeffrey Kelly

(57) ABSTRACT

An embodiment of the invention may include a method of forming a semiconductor structure, and the resulting semiconductor structure. The method may include removing a gate region from a layered stack located on a source/drain layer. The layered stack includes a first spacer located on the source drain layer, a dummy layer located on the first spacer, and a second spacer located on the dummy layer. The method may include forming a channel material above the source/drain layer in the gate region. The method may include forming a top source/drain on the channel material. The method may include forming a hardmask surrounding the top source/drain. The method may include removing a portion of the layered stack that is not beneath the hardmask.

14 Claims, 6 Drawing Sheets

(56) References Cited

U.S. PATENT DOCUMENTS

| | | |
|---|---|---|
| 8,916,927 B2 | 12/2014 | Bhuwalka |
| 9,640,667 B1 * | 5/2017 | Balakrishnan ........ H01L 29/201 |
| 9,698,262 B2 | 7/2017 | Pawlak |
| 9,870,957 B2 * | 1/2018 | Jeong ................... H01L 23/535 |
| 9,972,494 B1 | 5/2018 | Bentley |
| 10,096,709 B2 | 10/2018 | Le |
| 2009/0032845 A1 | 2/2009 | Zhu |
| 2016/0190312 A1 | 6/2016 | Zhang |
| 2020/0035691 A1 * | 1/2020 | Reznicek ......... H01L 21/26513 |

* cited by examiner

VERTICAL FET WITH SYMMETRIC JUNCTIONS

BACKGROUND

The present invention relates to field effect transistors, and more specifically, to vertical field effect transistors.

A field-effect transistor (FET) is an electronic device which uses an electric field to control the flow of current. FETs are 3-terminalled devices, having a source, gate, and drain terminal. FETs control the flow of current by the application of a voltage to the gate terminal, which in turn alters the conductivity between the drain and source terminals.

SUMMARY

An embodiment of the invention may include a method of forming a semiconductor structure. The method may include removing a gate region from a layered stack located on a source/drain layer. The layered stack includes a first spacer located on the source drain layer, a dummy layer located on the first spacer, and a second spacer located on the dummy layer. The method may include forming a channel material above the source/drain layer in the gate region. The method may include forming a top source/drain on the channel material. The method may include forming a hardmask surrounding the top source/drain. The method may include removing a portion of the layered stack that is not beneath the hardmask.

An embodiment of the invention may include a method of forming a semiconductor structure. The method may include removing a gate region from a layered stack located on a source/drain layer. The layered stack includes a first spacer located on the source drain layer, a dummy layer located on the first spacer, and a second spacer located on the dummy layer. The method may include forming a channel material above the source/drain layer in the gate region. The method may include forming a top source/drain on the channel material. The method may include forming a hardmask surrounding the top source/drain. The method may include performing an anneal causing the source/drain layer forming a bottom source/drain extension and causing the top source/drain into the channel material forming a top source/drain extension.

An embodiment of the invention may include a semiconductor structure. The semiconductor structure may include a bottom source/drain located on a substrate. The semiconductor structure may include a channel material located on the bottom source drain. The semiconductor structure may include a top source/drain located on a top surface of the channel material. The channel material includes a channel region, a top source/drain extension, and a bottom source/drain extension, and wherein the top source/drain extension and the bottom source/drain extension are substantially similar.

Figure 1:
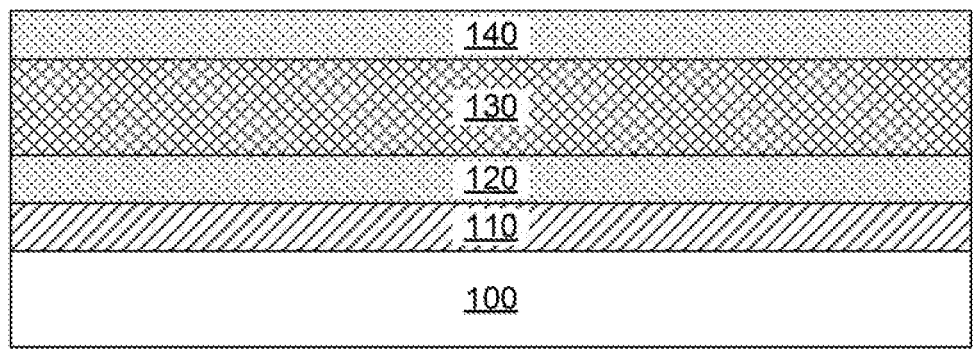
FIG. 1 depicts a cross-sectional view of a layered structure located on a substrate, according to an embodiment of the invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring to FIG. 1, a layer stack may be provided having a substrate 100, a source/drain layer 110, a first spacer layer 120, a dummy layer 130, and a second spacer layer 140. In some embodiments, the substrate 100 may be either a bulk substrate or a semiconductor on insulator (SOI) substrate. In embodiments where the substrate 100 is a bulk substrate, the material of the fins may be the same as the substrate 100 and there may be no identifiable boundary between the fins and the substrate 100. The substrate 100 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In embodiments where the substrate 100 is an SOI substrate, the fins may be formed from a top semiconductor layer separated from a base semiconductor substrate by a buried insulator layer (not shown). In such embodiments, the top semiconductor layer and the base semiconductor substrate 100 may be made of the same materials as the bulk substrate discussed above. The buried insulator layer may have a thickness ranging from approximately 100 to approximately 500 nm, preferably about 200 nm. In such embodiments, the fins may rest on the buried insulator layer, separated from the base semiconductor substrate.

Source/drain 110 may be located on substrate 100, acting as one of the source/drains for the vertical transistor. Source/drain 110 may be formed by doping a top layer of substrate 100, or alternatively from epitaxially growing the source/drain material above the substrate 100. In an example embodiment the source/drain 110 may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1 \times 10^{20}$ atoms/cm$^3$ to approximately $2 \times 10^{21}$ atoms/cm$^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{20}$ atoms/cm$^3$ to approximately $2 \times 10^{21}$ atoms/cm$^3$. Source/drain 110 may have a thickness ranging from approximately 20 nm to approximately 100 nm, preferably approximately 30 nm to approximately 60 nm.

A first spacer layer 120 may be located on the source/drain layer 110. The first spacer layer 120 may be made of any insulating material, such as silicon nitride, silicon oxide, silicon oxynitrides, or a combination thereof, and may have a thickness ranging from 4 nm to approximately 15 nm, preferably approximately 5 nm to approximately 10 nm. The first spacer layer 120 may be formed by any method known in the art.

A dummy layer 130 may be located on the first spacer layer 120. The dummy layer 130 may include a sacrificial gate structure, that may be later removed and replaced by a replacement gate dielectric, an optional work function metal and a replacement gate electrode. In an example embodiment, the dummy gate material may be made of a SiO or SiCO. Dummy layer 130 may have a thickness ranging from approximately 10 nm to approximately 30 nm, preferably approximately 15 nm to approximately 25 nm.

A second spacer layer 140 may be located on the source/drain layer 130. The second spacer layer 140 may be made of any insulating material, such as silicon nitride, silicon oxide, silicon oxynitrides, or a combination thereof, and may have a thickness ranging from 4 nm to approximately 15 nm, preferably approximately 5 nm to approximately 10 nm. The second spacer layer 140 may be formed by any method known in the art.

Figure 2:
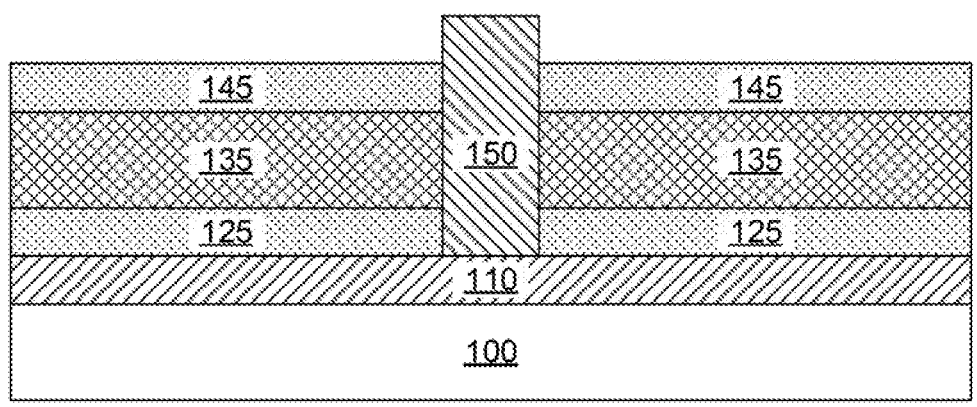
FIG. 2 depicts a cross-sectional view following removing a gate region of a layered structure and depositing a gate material, according to an embodiment of the invention.

Referring to FIG. 2, the portion of the layered structure may be removed and a channel material 150 may be grown in its placed. The removal of the layered structure may be performed by patterning a lithographic mask above, and performing an anisotropic etch, such as a RIE etch, to remove the material below the unpatterned portion of the lithographic mask stopping at Source/drain 110. Following the removal of the channel region, a channel material 150 may be epitaxially grown in its place. The channel material may be Silicon, SiGe, a II-VI material or a III-V material.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 3:
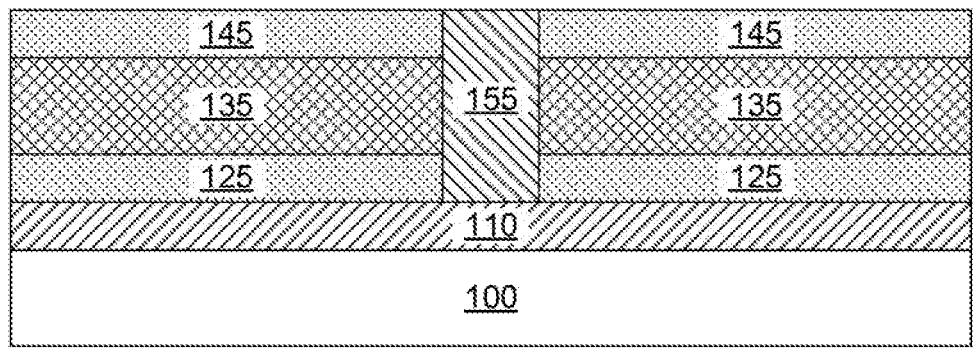
FIG. 3 depicts a cross-sectional view following removing planarizing the gate material with the layered structure, according to an embodiment of the invention.

Referring to FIG. 3, an overgrowth of channel material 150 may be removed, forming channel region 155. Removal of the overgrowth may be performed using CMP.

Figure 4:
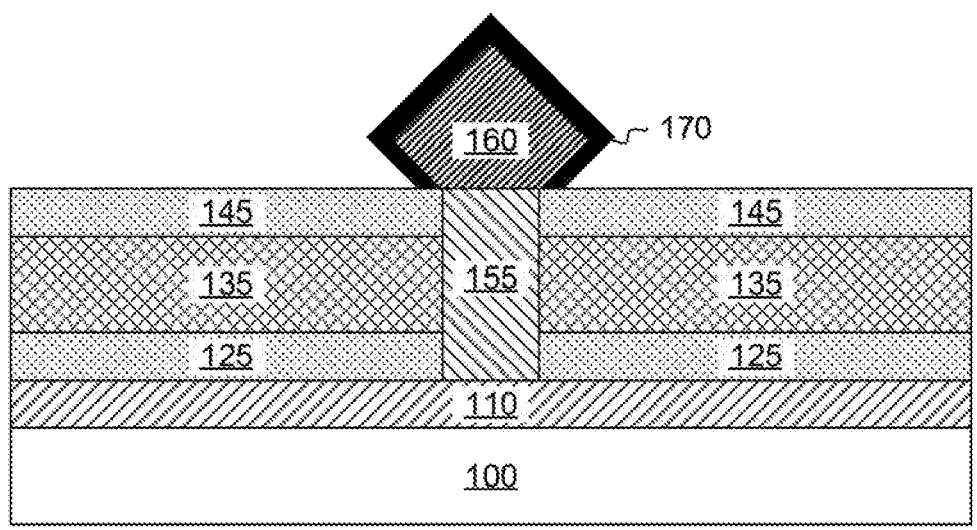
FIG. 4 depicts a cross-sectional view following forming a top source/drain contact and sacrificial material, according to an embodiment of the invention.

Referring to FIG. 4, Epitaxial growth of VFET top source/drain 160 and a source/drain sacrificial material 170 may be performed. Referring to FIG. 4, VFET top source/drain 160 is grown on top of channel region 155. The VFET top source/drain 160 may include a semiconductor material epitaxially grown on channel region 155. In some embodiments, a semiconductor material may be epitaxially grown on the existing crystal lattice of channel region 155. In an example embodiment, the semiconductor material may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1 \times 10^{20}$ atoms/cm$^3$ to approximately $2 \times 10^{21}$ atoms/cm$^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{20}$ atoms/cm$^3$ to approximately $2 \times 10^{21}$ atoms/cm$^3$. The source/drain sacrificial material 170 may be any material that can be selectively removed with respect to the top source/drain 160. In an embodiment, the source/drain sacrificial material 170 may be Silicon Germanium.

Figure 5:
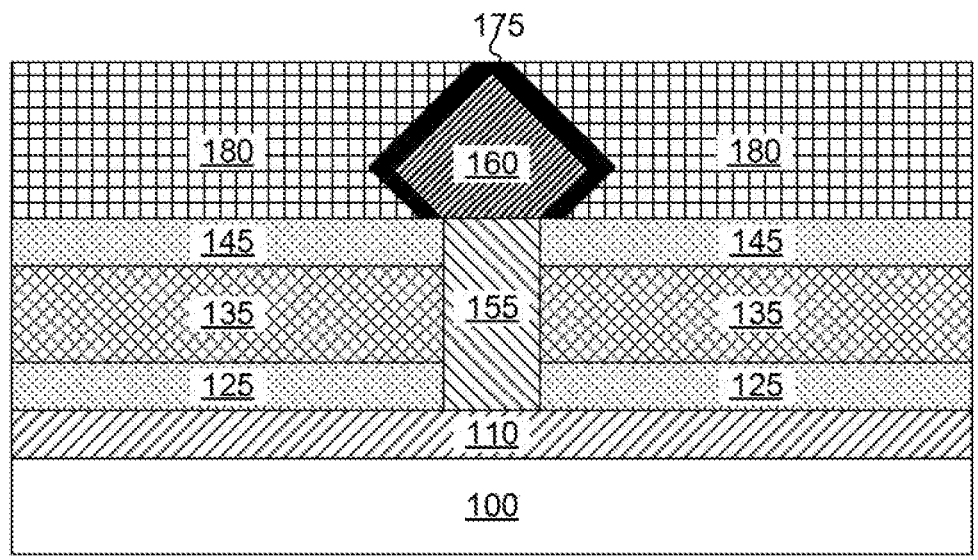
FIG. 5 depicts a cross-sectional view following forming an oxide around the sacrificial material, according to an embodiment of the invention.

Referring to FIG. 5, Oxide mold 180 layer may be deposited around and over source/drain sacrificial material 170, and CMP may be performed to create an exposed source/drain sacrificial material 175. Oxide mold 180 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. Following deposition of the oxide, a CMP may be performed to reduce the height of the oxide mold 180 below the height, and thus removing a portion, of the source/drain sacrificial material 170, forming an exposed source/drain sacrificial material 175.

Figure 6:
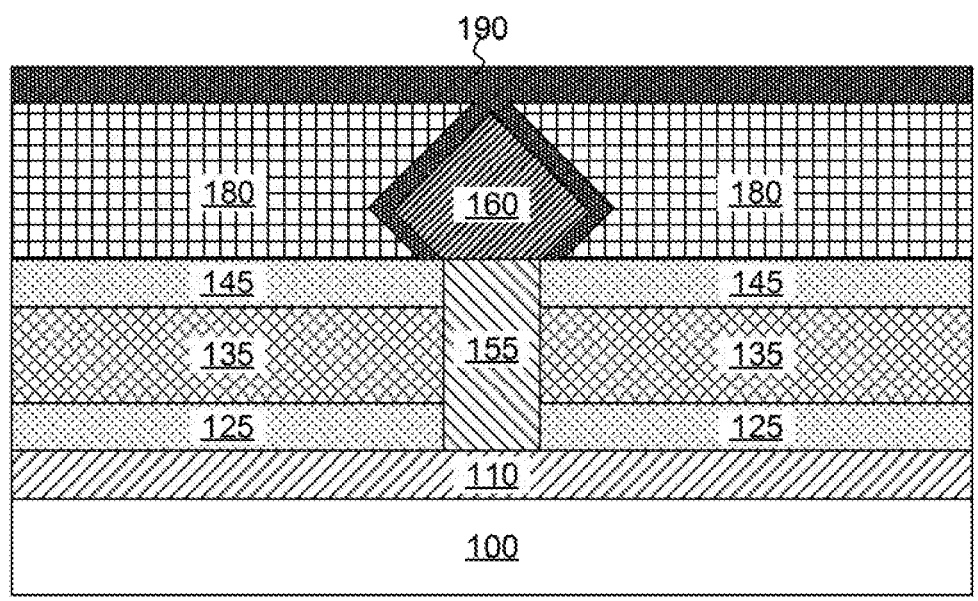
FIG. 6 depicts a cross-sectional view following removing the sacrificial material and depositing a hardmask, according to an embodiment of the invention.

Referring to FIG. 6, the exposed source/drain sacrificial material 175 may be removed and an initial hardmask 190 may formed around top source/drain 160. In embodiments using SiGe with a high concentration of Ge, the exposed source/drain sacrificial material 175 may be removed using hot SC1 or vapor HCl. The initial hardmask 190 may be formed using ALD deposition. The initial hard mask 190 may be formed from, for example, Titanium Nitride or Silicon Nitride.

Figure 7:
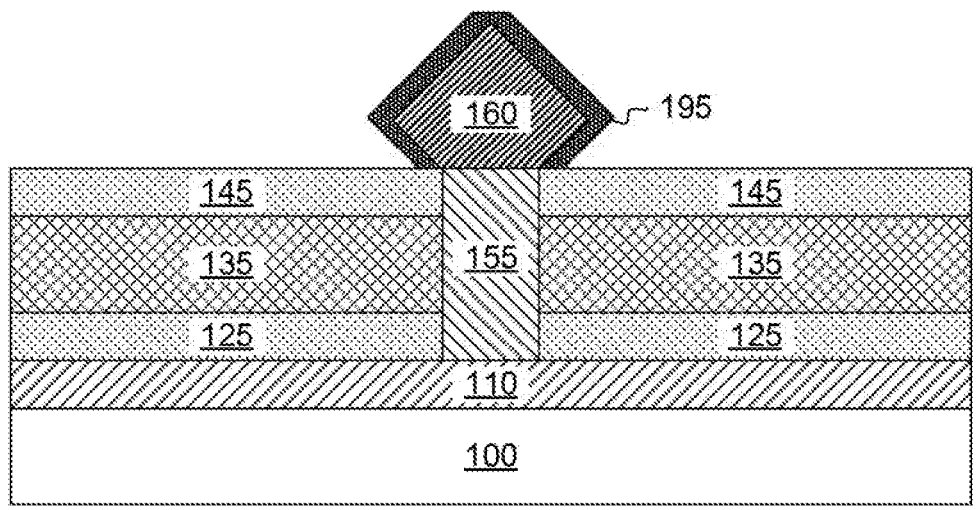
FIG. 7 depicts a cross-sectional view following removing the oxide, according to an embodiment of the invention.

Referring to FIG. 7, CMP may be performed on initial hardmask 190 and stop on Oxide Mold 180, forming hardmask 195. Following the CMP of the top layer of initial hardmask 190, oxide mold 180 may then be removed with a chemical etch, leaving only hardmask 195 surrounding top source/drain 160. The chemical etch of oxide mold 180 may be performed using DHF, BHF, SiCoNi, or other suitable etchants.

Figure 8:
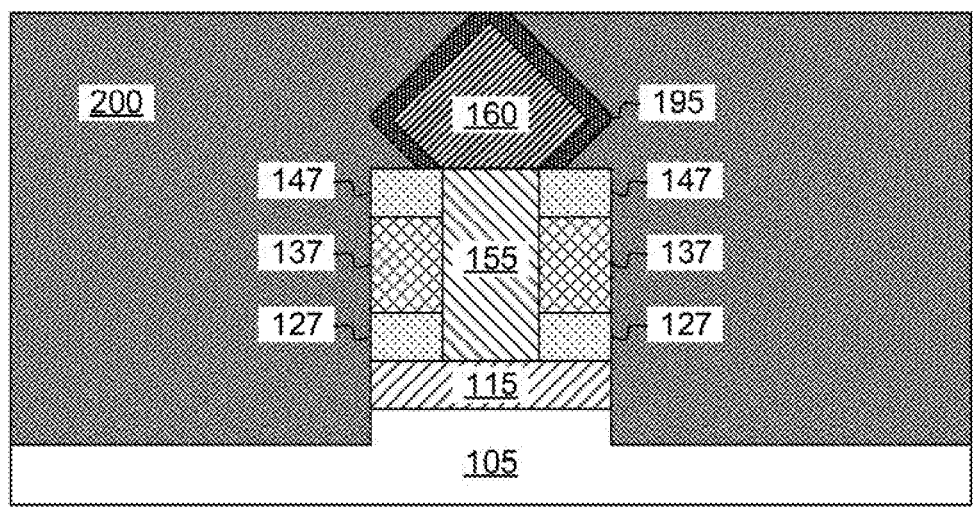
FIG. 8 depicts a cross-sectional view following patterning a gate and depositing a STI, according to an embodiment of the invention.

Referring to FIG. 8, an anisotropic etch may be performed, using hardmask 195 as a mask for the underlying structures. This may leave first spacer 127, dummy gate 137, second spacer 147, and intermediate bottom source/drain 115 below hardmask 195. STI 200 may be deposited around the resulting structure. STI 200 may be any suitable dielectric such as, for example, silicon oxide, silicon nitride, or silicon oxynitride. Following the etch, the first spacer 127 and second spacer 147 may be located completely beneath the hardmask 195.

Figure 9:
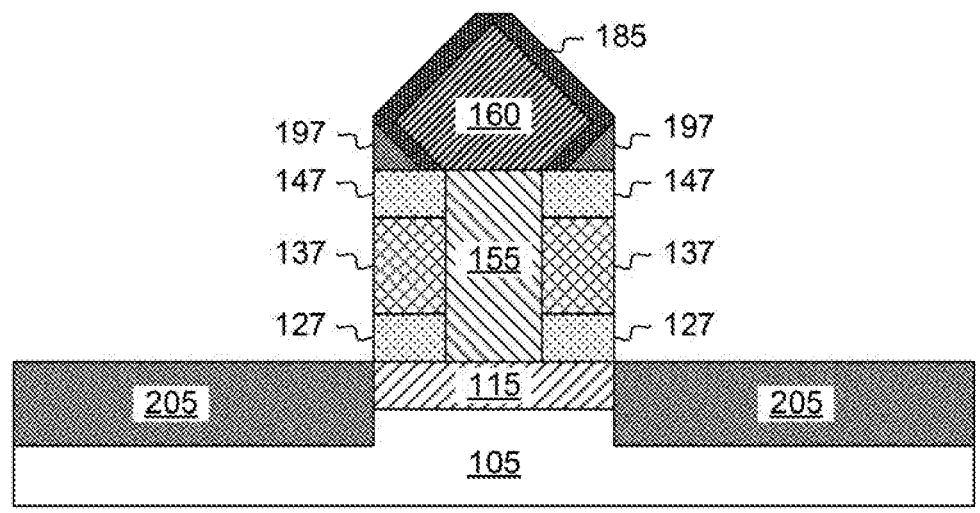
FIG. 9 depicts a cross-sectional view following removing a portion of the STI, according to an embodiment of the invention.

Referring to FIG. 9, STI 200 may be reduced to the spacer 127, thereby isolating intermediate bottom source/drain 115 from other structures. Formation of STI 205 from STI 200 may be performed using a wet etch process.

Figure 10:
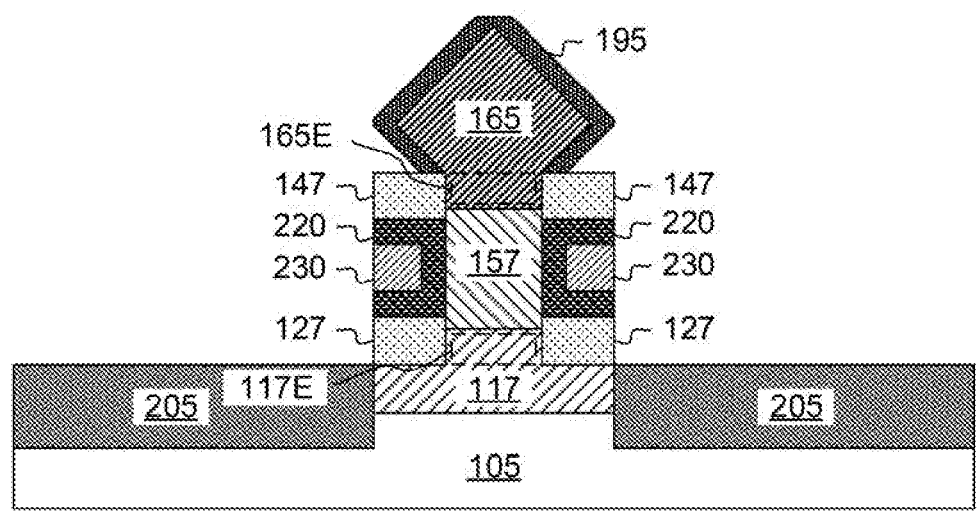
FIG. 10 depicts a cross-sectional view following an RMG process of the dummy material with an anneal, according to an embodiment of the invention.

Referring now to FIG. 10, after removing dummy gate 137 from FIG. 10, a gate dielectric layer 220 may be formed on the channel region 155, first spacer 127, and second spacer 147, where the gate dielectric layer 220 may be conformally deposited. The dummy gate 137 are typically removed simultaneously utilizing an etching process that is selective in removing the material that provides the dummy gate 137.

Following the removal of the dummy gate 137, the gate dielectric layer 220 may be conformally deposited by ALD and/or CVD. The gate dielectric layer 220 may be a high-k material, including but not limited to metal oxides such as hafnium oxide (e.g., HfO2), hafnium silicon oxide (e.g., HfSiO4), hafnium silicon oxynitride (HfwSixOyNz), lanthanum oxide (e.g., La2O3), lanthanum aluminum oxide (e.g., LaAlO3), zirconium oxide (e.g., ZrO2), zirconium silicon oxide (e.g., ZrSiO4), zirconium silicon oxynitride (ZrwSixOyNz), tantalum oxide (e.g., TaO2, Ta2O5), titanium oxide (e.g., TiO2), barium strontium titanium oxide (e.g., BaTiO3-SrTiO3), barium titanium oxide (e.g., BaTiO3), strontium titanium oxide (e.g., SrTiO3), yttrium oxide (e.g., Y2O3), aluminum oxide (e.g., Al2O3), lead scandium tantalum oxide (Pb(ScxTa1-x)O3), and lead zinc niobate (e.g., PbZn⅓ Nb⅔ O3). The high-k dielectric material may further include dopants such as lanthanum and/or aluminum. The stoichiometry of the high-k dielectric material may vary. In various embodiments, the gate dielectric layer 220 may have a thickness in the range of about 1.5 nm to about 2.5 nm.

In one or more embodiments, an optional work function layer may be deposited over the gate dielectric layer 220, where the optional work function layer may be conformally deposited by ALD and/or CVD. The optional work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof. The optional work function layer may have a thickness in the range of about 1 nm to about 11 nm, or may have a thickness in the range of about 2 nm to about 5 nm.

In one or more embodiments, the optional work function layer may include a thin a gate metal layer (not shown) which may be formed on the optional work function layer, where the gate metal layer may include a thin layer conformally deposited on the optional work function layer. A gate conductor 230 is deposited and patterned to form a gate electrode. The gate metal layer may be conformally deposited by ALD or CVD, where the gate metal layer may have a thickness in the range of about 5 Å to about 15 Å. The gate metal layer may be tungsten (W), aluminum (Al), titanium nitride (TiN), cobalt (Co), or a combination thereof. The total thickness of the gate metal layer and the optional work function layer may be in the range of about 6 nm to about 12 nm. Unneeded metal(s) (for portions of gate metal layer, optional work function layer, and gate conductor 230) may be etched away. Portions of the high-k layer 250 may also be removed in defining the gate structure for each channel region 155. In various embodiments, the high-k layer 250, the gate conductor 230, and optional work function layer may form a gate structure at least on opposite sides of the channel region 155. In various embodiments, the gate structure may wrap around three sides or four sides of the vertical fin.

In one or more embodiments, the gate conductor 230 may be deposited on high-k layer 250. In one or more embodiments, the gate conductor 230 may include tungsten (W). In various embodiments, the gate conductor 230 may extend laterally beyond the second spacer 147 to allow formation of a metal contact to the gate structure. The gate conductor 230 may be electrically isolated from the channel region 155 by first spacer 127.

Following the Replacement Metal Gate process, a reliability anneal may be performed. The reliability anneal, may be performed at a temperature from 700° C. to 1300° C., depending on the annealing time. Further, the reliability anneal may diffuse dopants from the intermediate bottom source/drain 115 into a bottom portion of the channel region 155 and to provide the bottom source/drain 117, and dopants from the VFET top source/drain 160 into the upper portion of the channel region 155 and to create a top source/drain 165. Typically higher temperatures require less annealing times. Annealing can be done by rapid thermal anneal (RTA), laser anneal, flash anneal, furnace anneal, or any suitable combination of those techniques. In one embodiment, the anneal is done at 1000° C. for 0.5 seconds. Other temperatures may also be used as long as the anneal temperature is capable of forming the bottom source/drain 117 and the top source/drain 165 shown in FIG. 10. In some embodiments, the anneal may be performed in an inert ambient such as, for example, helium and/or argon. In other embodiments, the anneal may be performed in a forming gas ambient. The duration of the anneal may vary so long as the duration of the anneal causes dopant diffusion and the formation of the bottom source/drain 117, and the top source/drain 165 shown in FIG. 10.

Following the drive in anneal, bottom source/drain 117 and top source drain 165 may include bottom extension region 117E and top extension region 165E, that are the result of dopant diffusion from the intermediate bottom source/drain 115 and VFET top source/drain 160 to the channel region 155. In embodiments where the intermediate bottom source/drain 115 and the VFET top source/drain are made of similar materials, the bottom extension region 117E and top extension region 165E may similar thicknesses, chemical composition, and chemical gradients due to the simultaneous drive in anneal that was performed. This may additionally form a symmetric channel region 155, whereas the amount of the channel region 155 that extends beyond the dummy gate 137, is substantially similar on the top and bottom end of the channel region 155. Such uniformity of geometry may lead to better, and more uniform, performance of the resulting VFET structure.

Figure 11A:
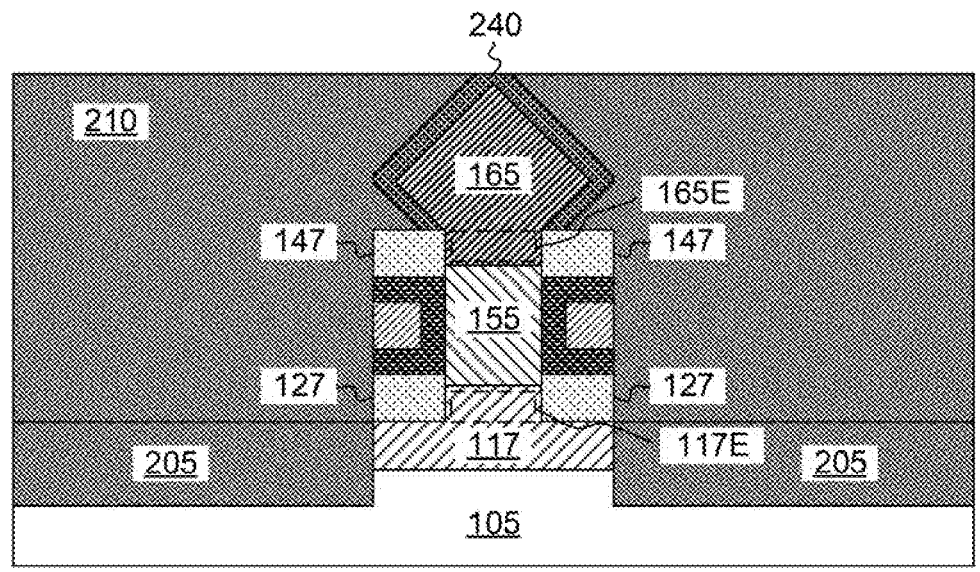
FIG. 11a depicts a cross-sectional view following contact formation of the FET structure, according to an embodiment of the invention.

Referring to FIG. 11a, space above and around the gate conductor 230 may be filled with a dielectric fill 210 to fill in the space between neighboring structures, including vertical devices, and provide electrical insulation between devices and components. The dielectric fill 210 may include an oxide, although other suitable dielectric materials may be employed. The dielectric fill 210 may be recessed down, exposing a top portion of the hardmask 195.

Still referring to FIG. 11a, following recessing the dielectric fill 210, the hardmask 195 may be removed, and replaced with a top contact 240. The hardmask 195 may be removed by selectively etching the hardmask 195 from around top source/drain 165. Additionally, the dielectric fill 210 may be lithographically patterned to allow for patterning of a contact for gate conductor 230 and a contact for bottom source/drain 117. The patterned gate contacts may be filled using CVD, and forming a top contact 240, a gate contact 243 and a bottom contact 247. Top contact 240, gate contact 243 and bottom contact 247 may be materials, such as, W or Co and may include a Ti or TiN liner on the top source/drain 165 and bottom source/drain 117.

Figure 11B:
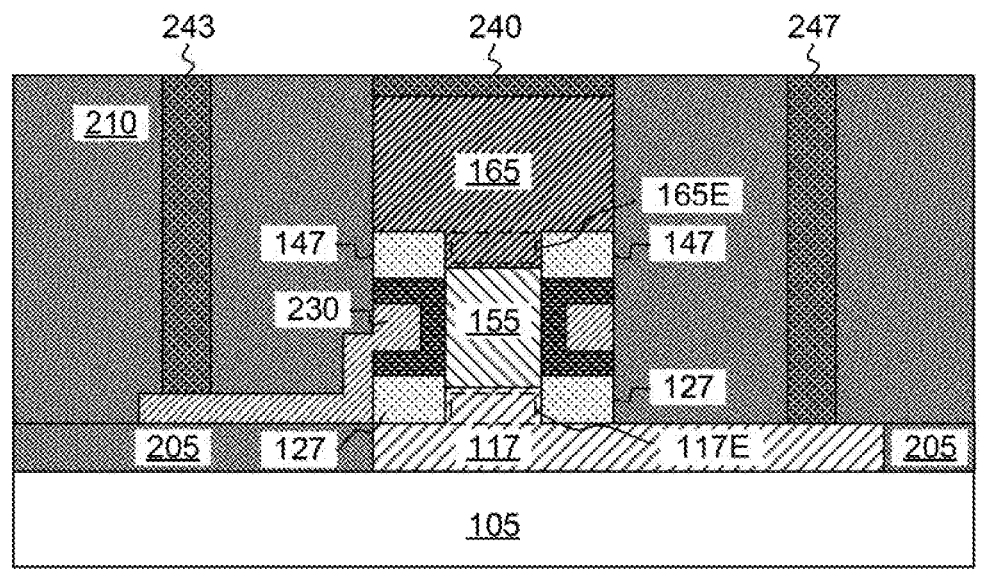
FIG. 11b depicts a cross-sectional view orthogonal to FIG. 11a following contact formation of the FET structure, according to an embodiment of the invention.

Referring to FIG. 11b, a cross-sectional view along the length of channel region 155 of the VFET structure of FIG. 11a rotated approximately 90 degrees is shown to illustrate an example placement of the gate contact 243 and bottom contact 247.

Referring to FIGS. 11a and 12b, a structure for a vertical field effect transistor is present. A bottom source drain 117 is electrically connected to a top source drain 165 through gate region 155. The bottom source drain 117 may extend beyond a bottom surface of the first spacers 127 with a bottom extension region 117E, while top source drain 165 may extend beyond a top surface of the first spacers 147 with a top extension region 165E. The top extension region 165E and the bottom extension region 117E may be substantially symmetrical in shape and concentration gradient due to the having been formed with the same drive-in anneal. Top source drain 165 may be electrically connected to top contact 240 with a wrap-around contact, which may reduce contact resistance between the top source drain 165 and the top contact 240. Additionally, first spacer 127 and second spacer 147 may be located entirely below the top contact 240, as top contact 240 filled the void of the hardmask 195 used to pattern the spacers.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor device comprising:
    removing a gate region from a layered stack located on a source/drain layer, wherein the layered stack comprises a first spacer located on the source/drain layer, a dummy layer located on the first spacer, and a second spacer located on the dummy layer;
    forming a channel material above the source/drain layer in the gate region;
    forming a top source/drain on the channel material;
    forming a hardmask surrounding the top source/drain, wherein a thickness of the hardmask surrounding the top source/drain is substantially uniform;
    removing a portion of the layered stack that is not beneath the hardmask;
    forming a dielectric layer covering the hardmask;
    removing a top portion of the dielectric layer to expose the hardmask;
    removing the hardmask; and
    depositing a metal contact surrounding the top source/drain.

2. The method of claim 1 further comprising performing an anneal causing the source/drain layer forming a bottom source/drain extension and causing the top source/drain into the channel material forming a top source/drain extension.

3. The method of claim 2, wherein the top source/drain extension and the bottom source/drain extension are substantially similar.

4. The method of claim 3, wherein a bottom of the top source/drain extension does not extend past a bottom of the second spacer.

5. The method of claim 1 further comprising:
removing the dummy layer;
depositing a gate stack comprising a gate dielectric and a gate conductor in a void left by the dummy layer.

6. The method of claim 5 wherein the gate dielectric, the first spacer, and the second spacer are entirely below the metal contact.

7. A method of forming a semiconductor device comprising:
removing a gate region from a layered stack located on a source/drain layer, wherein the layered stack comprises a first spacer located on the source/drain layer, a dummy layer located on the first spacer, and a second spacer located on the dummy layer;
forming a channel material above the source/drain layer in the gate region;
forming a top source/drain on the channel material;
forming a hardmask surrounding the top source/drain; and
performing an anneal causing the source/drain layer forming a bottom source/drain extension and causing the top source/drain into the channel material forming a top source/drain extension.

8. The method of claim 7, wherein the top source/drain extension and the bottom source/drain extension are substantially similar.

9. The method of claim 8, wherein a bottom of the top source/drain extension does not extend past a bottom of the second spacer.

10. The method of claim 7 further comprising removing a portion of the layered stack that is not beneath the hardmask.

11. The method of claim 10 further comprising:
forming a dielectric layer covering the hardmask;
removing a top portion of the dielectric layer to expose the hardmask;
removing the hardmask; and
depositing a metal contact surrounding the top source/drain.

12. The method of claim 7 further comprising:
removing the dummy layer; and
depositing a gate stack comprising a gate dielectric and a gate conductor in a void left by the dummy layer.

13. The method of claim 12, further comprising:
forming a dielectric layer covering the hardmask;
removing a top portion of the dielectric layer to expose the hardmask;
removing the hardmask; and
depositing a metal contact surrounding the top source/drain.

14. The method of claim 13 wherein the gate dielectric, the first spacer, and the second spacer are entirely below the hardmask.

* * * * *